US006330681B1

(12) United States Patent
Cote et al.

(10) Patent No.: US 6,330,681 B1
(45) Date of Patent: Dec. 11, 2001

(54) METHOD AND APPARATUS FOR CONTROLLING POWER LEVEL DURING BIST

(75) Inventors: Jean-François Cote; Benoit Nadeau-Dostie; Pierre Gauthier, all of Aylmer (CA)

(73) Assignee: Logicvision, Inc., San Jose, CA (US)

( * ) Notice: Subject to any disclaimer, the term of this patent is extended or adjusted under 35 U.S.C. 154(b) by 0 days.

(21) Appl. No.: 09/218,764

(22) Filed: Dec. 22, 1998

(30) Foreign Application Priority Data

Dec. 31, 1997 (CA) .................................................. 2226061

(51) Int. Cl.[7] ...................................................... G06F 1/32
(52) U.S. Cl. ............................................ 713/322; 713/601
(58) Field of Search ................................. 713/322, 501, 713/601; 702/117; 714/718, 719, 724, 733, 735

(56) References Cited

U.S. PATENT DOCUMENTS

| 4,503,537 | 3/1985 | McAnney ............................ 371/25 |
| 4,969,148 | 11/1990 | Nadeau-Dostie et al. .......... 371/21.1 |
| 5,329,533 | 7/1994 | Lin ..................................... 371/22.3 |
| 5,349,587 | 9/1994 | Nadeau-Dostie et al. .......... 371/22.3 |
| 5,614,838 | 3/1997 | Jaber et al. ........................... 324/765 |
| 5,655,127 | * 8/1997 | Rabe et al. ...................... 395/750.04 |
| 6,037,813 | * 3/2000 | Eto et al. ......................... 713/501 X |

* cited by examiner

Primary Examiner—Thomas M. Heckler
(74) Attorney, Agent, or Firm—Sheridan Ross P.C.

(57) ABSTRACT

An improvement in a method of testing a digital circuit or system, having a plurality of scannable memory elements, in accordance with conventional BIST methods in which, at a reference clock, a test stimulus is shifted into the memory elements, the response of the elements is captured and the captured data is shifted out of the elements and analyzed, the improvement comprising controlling the average power consumption of the circuit during the test by suppressing clock pulses from the reference clock during phases of the test that do not require the maximum level of activity or in which the performance of the circuit is not to be evaluated; and, suppressing no clock pulses from the reference clock in phases of the test in which the performance of the circuit is to be evaluated, so that the conditions are substantially as those of normal mode of operation of the circuit.

23 Claims, 3 Drawing Sheets

METHOD AND APPARATUS FOR CONTROLLING POWER LEVEL DURING BIST

The present invention generally relates to digital circuits and, more specifically, to a mechanism for modifying the power consumption and noise conditions of a digital circuit (or system) under test. It is more specifically applicable to circuits implementing built-in self-test (BIST).

BACKGROUND OF THE INVENTION

The behavior of a circuit under test is often modified to increase the level of activity of all its components to facilitate testing of the circuit. However, the reconfigured circuit might consume an average amount of power that is significantly higher from that measured during normal operation for the same clock frequency. This is especially true when the circuit is tested at high-speed to detect defects that might cause delay faults, for example. Excessive power consumption due to the increased circuit activity (or toggle rate) can damage the circuit itself or the test equipment and it can also invalidate the results of the test.

The additional stress caused by a controlled amount of additional power consumption can, however, be used to evaluate the reliability of the circuit. It allows the temperature of the circuit to be increased without requiring additional equipment (e.g. hot chuck, furnace). The elevated temperature is known to reduce the performance of a circuit. This kind of test is used to screen circuits that must be able to function at high temperature.

Jaber et al U.S. Pat. No. 5,614,838 discloses a reduced power apparatus and method for testing high speed components. The method is only applicable to a specific type of circuit known as Level-Sensitive Scan Design (LSSD), where separate clock sources are needed to control the circuit in normal and test modes of operation. Even though the patentee claims that the method is applicable to other types circuits, it is neither obvious nor practical to use the method for circuits other than LSSD circuits. In general, only one clock is available for controlling normal and test modes of operation (e.g. multiplexed scan). Therefore, it is not possible to gate the clock during the shift operations. Also, the method does not allow adjustment of the level of power consumption, which might invalidate the performance test results.

SUMMARY OF THE INVENTION

The present invention is used in combination with BIST methods for controlling the amount of power consumption of a digital circuit or system under test. Since the power level can, in many cases, be made proportional to the test clock or frequency for a given set of environmental conditions such as supply voltage and temperature, the present invention proposes a flexible programmable clock control mechanism allows the average power consumption to be set by suppressing clock pulses during the phases of the test that do not require the maximum level of activity. In other phases of the circuit where the performance of the circuit is being evaluated, no clock pulses are suppressed so that the conditions are close as possible, if not identical, to the normal mode of operation. The programmability is necessary in order to test the circuit under various sets of conditions that occur at different times in the life cycle of the circuit under test (e.g. wafer probe, package test, board manufacturing, system burn-in, field maintenance) using only available system clocks.

The present method is compatible with Phase-Locked Loop (PLLs) used to synchronize the circuit with other circuits of the system and as a clock multiplier. The method can also be used with several known BIST methods such as those disclosed in U.S. Pat. Nos. 5,329,533 (Lin), 4,503,537 (McAnney), 5,349,587 (Nadeau-Dostie et al), 4,969,148 (Nadeau-Dostie et al) and co-pending application Ser. No. 08/752,499 (Nadeau-Dostie et al), incorporated herein by reference. For each of these methods, there is an interval of time in which the clock should not be suppressed in order to evaluate the performance of the circuit under test is or can be generated.

One aspect of the present invention is generally defined as an improvement in a method of testing a digital circuit or system, having a plurality of scannable memory elements, in accordance with conventional BIST methods in which, at a reference clock, a test stimulus is shifted into the memory elements, the response of the elements is captured and the captured data is shifted out of the elements and analyzed, the improvement comprising controlling the average power consumption of the circuit during the test by suppressing clock pulses from the reference clock during phases of the test that do not require the maximum level of activity or in which the performance of the circuit is not to be evaluated; and, suppressing no clock pulses from the reference clock in phases of the test in which the performance of the circuit is to be evaluated, so that the conditions are substantially as those of normal mode of operation of the circuit.

Another aspect of the present invention is generally defined as a clock controller for use during testing of a digital circuit or system, comprising means responsive to a reference clock applied to the controller for generating a test clock signal for use by the digital circuit; the means including means responsive to a first value of a test phase signal for periodically suppressing clock cycles from the reference clock so as to operate the circuit a lower power level than a maximal power level and responsive to a second value of the test phase signal for not suppressing clock cycles from the reference clock so as to operate the circuit at the frequency of the reference clock.

BRIEF DESCRIPTION OF THE DRAWINGS

These and other features of the invention will become more apparent from the following description in which reference is made to the appended drawings in which.

DETAILED DESCRIPTION OF PREFERRED EMBODIMENTS OF THE INVENTION

Figure 1:
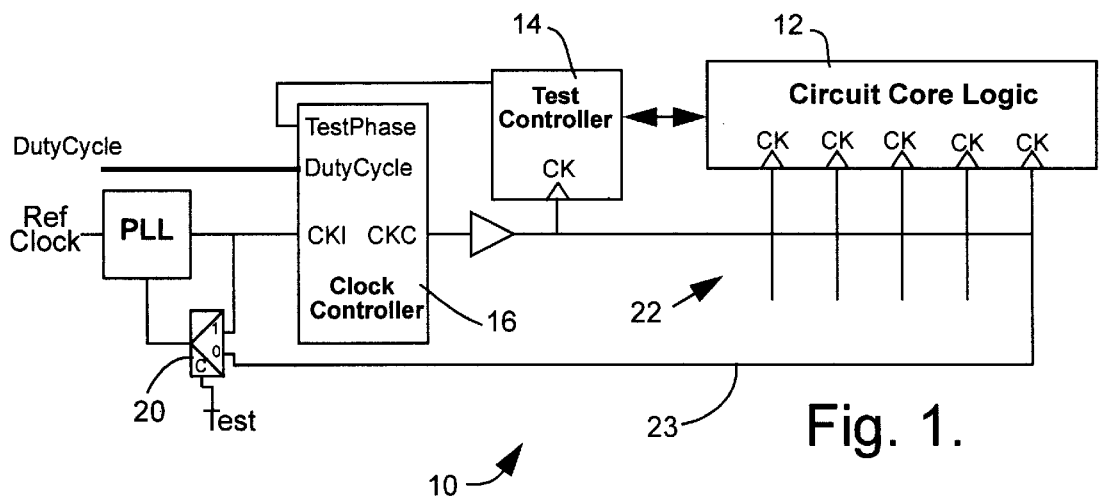
FIG. 1 diagrammatically illustrates a portion of a digital circuit including core logic, a test controller and a clock controller according to a preferred embodiment of the present invention.

FIG. 1 diagrammatically illustrates a portion of a digital circuit 10 having a circuit core logic 12, a test controller 14, a clock controller 16, an optional Phase-Lock Loop (PLL)

18 and a multiplexer 20. Core logic 12 implements the system functions during the normal mode of operation of the circuit and includes scannable memory elements, not shown but well known in the art, into which a test stimulus may be shifted, the response of the memory elements captured, shifted-out and analyzed in accordance with conventional BIST methods. The core logic is connected to a clock distribution tree 22 to optimize the performance of the circuit. The clock distribution tree, in turn, is provided with a clock signal, CKC, generated by clock controller 16, as explained later.

Test controller 14 is provided to enable performance testing of the circuit. It is also connected to the clock distribution tree 22. When several clocks are used during normal operation, the test controller can derive additional clocks from the branch of the clock distribution tree having the highest frequency.

Clock controller 16 provides the clock signal that is used by the core logic and the test controller. Clock controller 16 receives a clock input CKI from either a reference clock 24 or from the optional Phase-Lock Loop 18 and outputs clock signal, CKC, as previously mentioned. Clock controller 16 also receives a DutyCycle input signal and a TestPhase input signal. A multiplexer 20 is controlled by a Test Mode signal, TM, and is operable to select between the output of the PLL and the output of the clock controller and apply the selected signal to the PLL.

The PLL 18 is an optional component of the circuit. However, PLLs are common in high-performance circuits. A PLL has been included to show that the feedback path 23 used to synchronize the core logic with the reference clock must be modified during test mode. Since the method of adjusting the power level involves the suppression of clock pulses, the PLL would not lock onto a stable frequency during the test mode, invalidating the performance test results. The different feedback path would cause the core logic to no longer be in phase with the reference clock. However, this is not important during test mode.

It will be understood by those skilled in the art that the reference clock and the signal fed back from the end of the clock distribution tree should be synchronized. This may be achieved by providing an additional multiplexer or other such means. However, inasmuch as this feature does not form part of the invention, it has not been illustrated and is not described further.

The TestPhase signal is either low (0) and high (1). A low TestPhase input indicates that the power level is to be adjusted to the fraction of the power level specified by the DutyCycle input signal. A high TestPhase signal indicates that the circuit is to be operated at the frequency of the reference clock signal applied to the clock controller and generally indicates that a burst of clock pulses is required to measure the performance of the circuit. The number of clock cycles is usually relatively small, in the order of 2 to 8 clock cycles, so that the average power consumption of the circuit is not affected. However, the transients and noise conditions which arise during the performance test measurement are comparable to those which would occur during normal operation of the circuit.

The DutyCycle signal is representative of the desired power level to be applied to the circuit during non-performance critical phases or portions of a test. The Duty-Cycle signal is encoded as a binary number that represents a desired fraction of the maximal power level. The maximal power is expressed as $2^k$ so that the smallest fraction of the maximal power level is expressed as $2^{-k}$, where k is an integer. Thus, k bits are used to encode the power level in $2^{-k}$ increments. The number of bits, k, is chosen to accommodate requirements in terms of resolution and dynamic range of the power level.

By way of example, if is desired to perform one phase of a test at ¼ of the maximal power, DutyCycle would be set to 01, and k would be set to 2 so that the maximal power would be 4 ($2^2$). The DutyCycle code may be loaded into a register (not shown) designed into the circuit, it may be input to the circuit prior to a test or it may be generated internally of the circuit by the test controller during a test.

Figure 2:
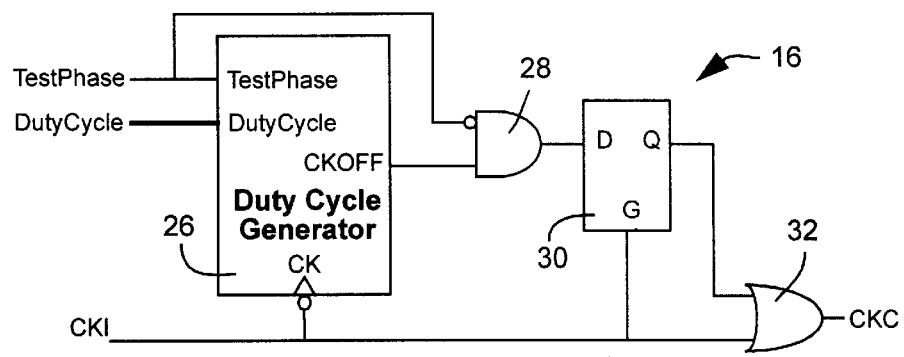
FIG. 2 diagrammatically illustrates a clock controller according to a preferred embodiment of the invention.
Figure 5:
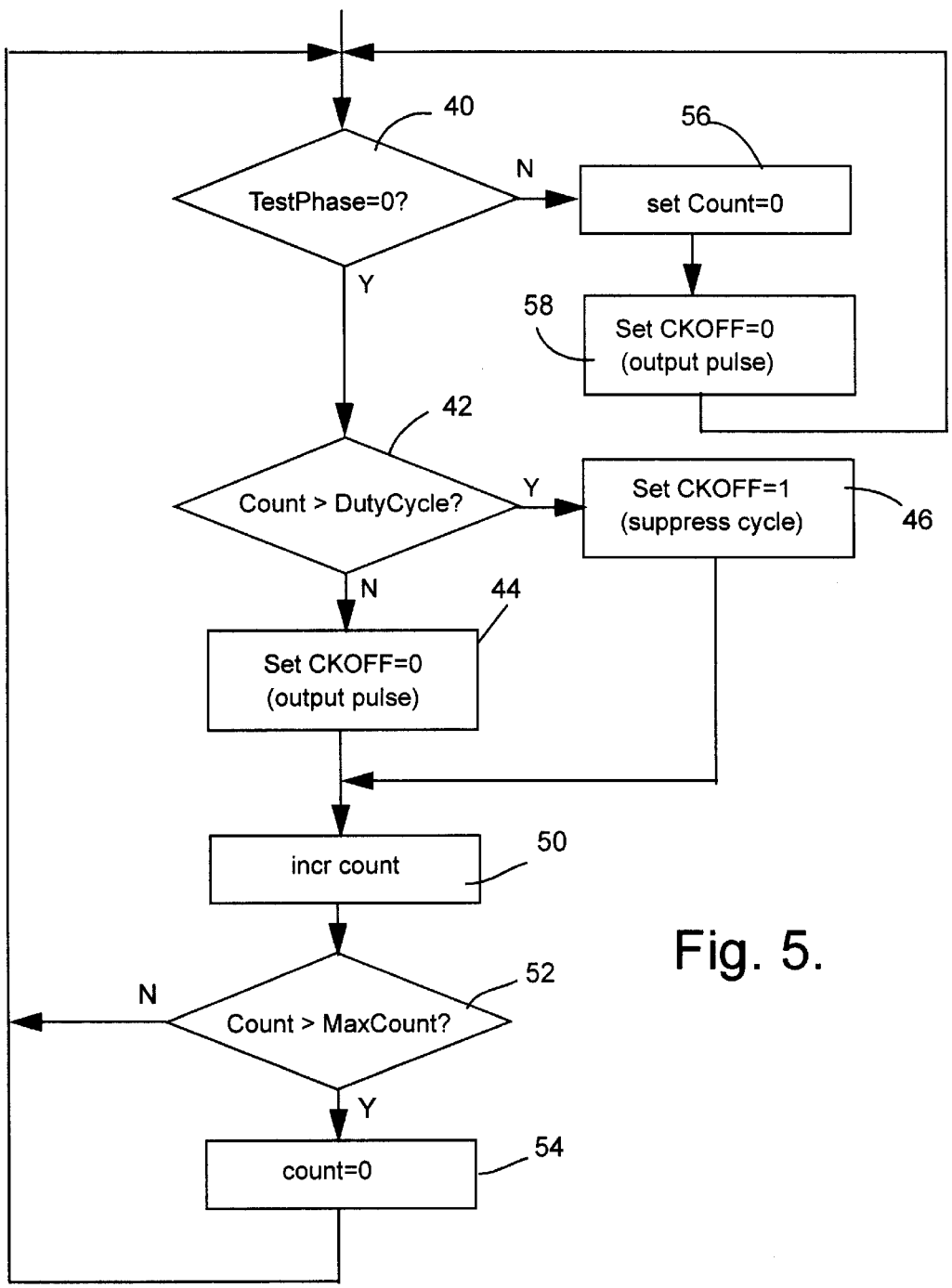
FIG. 5 is a flow chart illustrating the various steps in the operation of the clock controller according to a preferred embodiment of the invention.

FIG. 2 shows a more detailed view of clock controller 16. Clock controller 16 is comprised of a simple finite-state machine, called a duty cycle generator 26, an AND gate 28, a transparent latch 30 and an OR gate 32. Duty cycle generator 26 provides an output signal, CKOFF, and is comprised of a counter and a comparator. The counter and comparator are illustrated in the block diagram of FIG. 5 described below. The counter has the same number of bits, k, as the DutyCycle input. In the example mentioned earlier in which it was desired to perform a test of one phase at ¼ of maximal power, the counter would be two-bit counter. The counter is initialized to 0 before a test begins and whenever TestPhase goes high. The various sequence of steps in the operation of the clock controller may be best understood by referring to FIG. 5 described hereinbelow.

The first step 40, determines whether TestPhase is high or low. In general, when TestPhase is low, the power level is to be adjusted to the fraction specified by DutyCycle and the counter continuously cycles through counting from 0 to $2^k-1$. Thus, if k is 2, as in the above example, the counter counts from 0 to 3 continuously until this cycle is broken by TestPhase going high.

The first step 42 which is executed after TestPhase goes low is to determine whether the count is less than or equal to the DutyCycle. If it is, the clock is enabled by setting CKOFF equal to 0 at step 44, which outputs a clock pulse. When the count exceeds the value of DutyCycle, the clock is disabled by setting CKOFF equal to 1 as indicated at step 46, which suppresses a clock pulse. In either case, the counter then increments at step 50 and its new value is compared at step 52 with its maximum value, MaxCount, which in the example is 3. When the value is less than or equal to MaxCount, the process returns to step 42 and the cycle repeats. When the count exceeds MaxCount, the count is re-initialized to 0 at step 54 and then returns to step 40 where the clock controller determines whether the value of TestPhase has changed.

Thus, when DutyCycle is 01, one output pulse would be generated for every four pulses of the reference clock and the other three would be suppressed. If DutyCycle was assigned the binary value of 11 (2), two consecutive output pulses would be generated and they would be followed by the suppression of two consecutive pulses.

Figure 3:
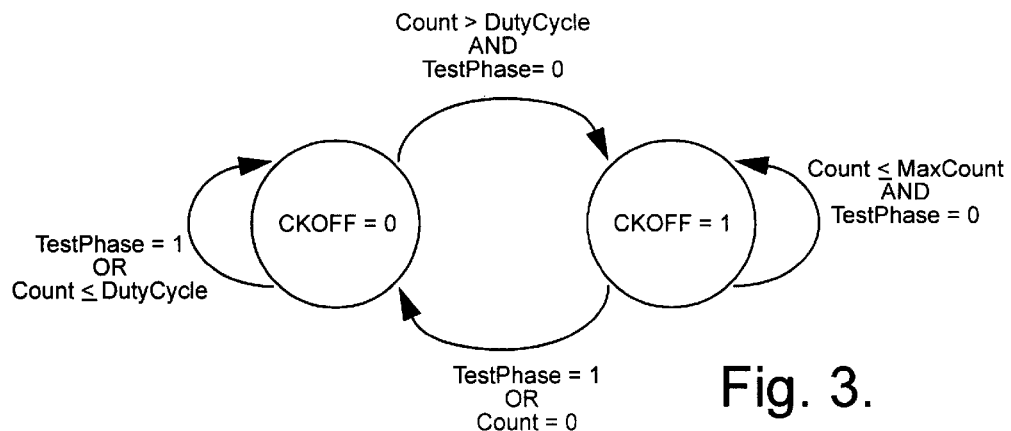
FIG. 3 is a state diagram for a clock controller according to a preferred embodiment of the invention.

When TestPhase goes high, the counter is re-initialized to 0 at step 56 and remains at that value for as long as TestPhase is high. In addition, CKOFF is set to 0 at step 58, which enables the clock and results in an output pulse for each pulse of the reference clock. Thus, as long as TestPhase remains high, the clock controller will output a clock signal at the same frequency as the reference clock. The behavior of the duty cycle generator is also precisely summarized in the state diagram of FIG. 3.

Figure 4:
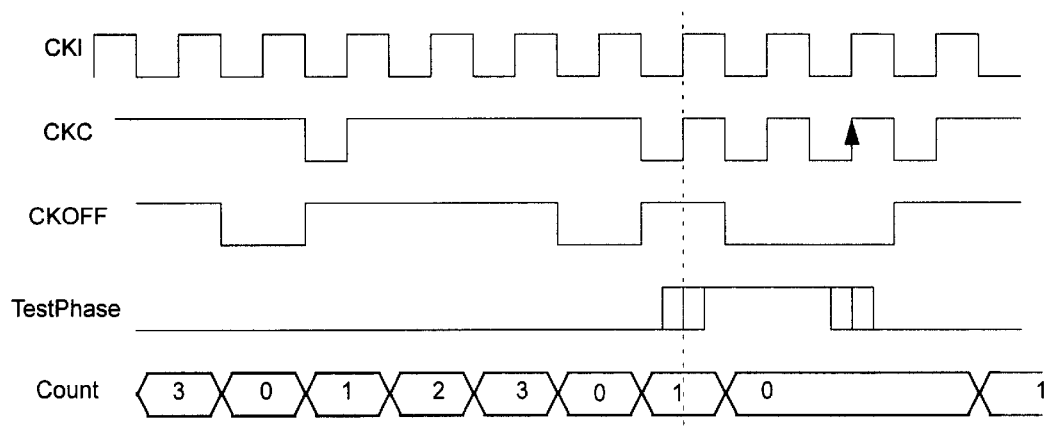
FIG. 4 is a timing illustrating the operation of the clock controller according to a preferred embodiment of the invention.

The timing diagram in FIG. 4 further illustrates the example in which two bits are used to encode the power level and the desired power level is ¼ of the maximum power level (DutyCycle=01). As can be seen, while TestPhase is low, the counter (Count) counts from 0 to 3 continuously, enabling the clock for one cycle out of every four cycles of the reference clock until TestPhase becomes 1. The latter forces the counter to return to 0 and results in a burst of consecutive clock cycles. TestPhase also enables the clock by forcing the output of the AND gate to 0. TestPhase remains high for as long as consecutive clock cycles are required by the test controller. Once TestPhase goes back to low, the counter resumes its cycle. In general non-performance critical phases of an internal test are performed at the lower power, lower frequency mode (TestPhase low). These phases would include, for example, Scan-In and Scan-Out operations, and the like. Performance critical operations, such a Capture operations, are performed at the frequency of the reference or test clock applied to the clock controller.

Thus, the present invention provides an improved method of testing digital circuits by controlling the average power consumption of the circuit during the test using a single reference clock. This is achieved by suppressing clock pulses from the test or reference clock during phases of the test that do not require the maximum level of activity or in which evaluation of the performance of the circuit is not to be evaluated; and, by not suppressing clock pulses from the reference clock in phases of the test in which the performance of the circuit is to be evaluated so that the conditions are substantially as those of normal mode of operation of the circuit.

It will be seen that the above described method and circuit allows performance testing to be performed concurrently with normal testing of the circuit using only one reference clock input during testing.

There are two important timing considerations to take into account in the implementation of this invention. First, the TestPhase signal should always be generated using the falling edge of the clock CKC, as shown by the vertical dashed line in FIG. 4, to maximize the time within which the TestPhase signal can propagate from the test controller to the clock controller (i.e. one full period of the reference clock).

Second, the use of a transparent latch prevents potential glitches from occurring at the clock output CKC. On the rising edge of the clock, CKI, the clock output CKC is set to 1 irrespective of the current state of transparent latch 30. Then, the latch is made transparent to allow new values of TestPhase and CKOFF to propagate through the latch. Due to potentially long propagation delays from the test controller to the clock controller, the value at the D input and Q output of the transparent latch might not be stable, but these possible glitches are masked by the fact that CKI is 1 at the input of the OR gate. Therefore, the output clock CKC remains at 1. However, the D input of the transparent latch must be stable on the falling edge of the clock CKI which will latch its value. This value will determine whether a low-going clock pulse will be produced at clock output CKC.

It should be understood that the features of the clock controller can be integrated with other features requiring control of the clock. Specifically, it is easy to add a mechanism that will stop the clock independently of the state of the counter for diagnostic purposes. It might also be necessary to be able to choose from a multiplicity of input clocks to be applied to CKI input of the clock controller, again for diagnostic purposes. All of these variations are within the scope of this invention.

We claim:

1. A clock controller for use during testing of a digital circuit or system, comprising:

means responsive to a reference clock applied to said controller for generating a test clock signal for use by said digital circuit;

said means including means responsive to a first value of a test phase signal for periodically suppressing clock cycles from said reference clock so as to operate said circuit at a lower power level than a maximal power level and responsive to a second value of said test phase signal for not suppressing clock cycles from said reference clock so as to operate said circuit at the frequency of said reference clock.

2. A clock controller as defined in claim 1, said means for generating including a duty cycle generator for generating first and second values of a clock disable signal for disabling and enabling clock cycles of said reference clock.

3. A clock controller as defined in claim 2, said duty cycle generator including a counter having a clock input for receiving said reference clock and a comparator for comparing the count of said counter against a predetermined value, said counter being responsive to said first value of said test phase signal by continuously counting clock cycles between 0 and a maximum value indicative of a maximal power level, said comparator producing said second value of said clock disable signal when said count is less than or equal to said predetermined value so as to generate an output pulse and for producing said first value of said clock disable signal so as to suppress a reference clock pulse.

4. A clock controller as defined in claim 2, further including means responsive to said first and second test phase signals and said clock disable signal for generating said test clock signal.

5. A clock controller as defined in claim 1, said means responsive to said first value of said test phase signal being further responsive to a power level signal representative of a desired fraction of the maximal power level for suppressing all but a number of clock cycles specified by said power level signal from consecutive sequences of a number of clock cycles of said reference clock representative of said maximal power level.

6. A clock controller as defined in claim 1, said clock controller further including:

a duty cycle generator having a test phase input for receiving said test phase signal, a duty cycle input for receiving a duty cycle signal representative of said lower power level, and a clock input for said reference clock, said duty cycle generator generating a clock disable signal for each cycle of said reference clock in response to said second value of said test phase signal and otherwise generating a clock disable signal for only one cycle of each of a predetermined number of cycles of said reference clock specified by said duty cycle signal;

an AND gate for receiving said test phase signal and said clock disable signal and providing an output;

a transparent latch having a clock input for receiving said reference clock, an input for receiving said output of said and gate output and a latch output; and an OR gate having an input for said reference clock and an input for said latch output.

7. A clock controller as defined in claim 6, said duty cycle generator further including a counter having a clock input for receiving said reference clock and a comparator for comparing the count of said counter against a predetermined value, said counter being responsive to said first value of said test phase signal by continuously counting clock cycles between 0 and a maximum value indicative of a maximal power level, said comparator producing a second value of said clock disable signal when said count is less than or equal to said predetermined value so as to generate an output pulse and for producing a first value of said clock disable signal when said count is greater than said predetermined value so as to suppress a reference clock pulse.

8. A clock controller for use during testing of a digital circuit or system, comprising:

means responsive to a reference clock applied to said controller for generating a test clock signal for use by said digital circuit;

said means including means responsive to a first value of a test phase signal for periodically suppressing clock cycles from said reference clock so as to operate said circuit at a lower power level than a maximal power level and responsive to a second value of said test phase signal for not suppressing clock cycles from said reference clock so as to operate said circuit at the frequency of said reference clock, said means responsive to said first test phase signal being further responsive to a power level signal representative of a desired fraction of the maximal power level for suppressing all but a first predetermined number of clock cycles from each of a second predetermined number of clock cycles of said reference clock;

said clock controller further including:

a duty cycle generator having a test phase input for receiving said test phase signal, a duty cycle input for receiving a duty cycle signal representative of said lower power level, and a clock input for said reference clock, said duty cycle generator generating a clock disable signal for each cycle of said reference clock in response to said second value of said test phase signal and otherwise generating a clock disable signal for only one cycle of each of a predetermined number of cycles of said reference clock specified by said duty cycle signal;

an AND gate for receiving said test phase signal and said clock disable signal and providing an output;

a transparent latch having a clock input for receiving said reference clock, an input for receiving said output of said AND gate output and a latch output; and an OR gate having an input for said reference clock and an input for said latch output;

said duty cycle generator further including a counter having a clock input for receiving said reference clock and a comparator for comparing the count of said counter against a predetermined value, said counter being responsive to said first value of said test phase signal by continuously counting clock cycles between 0 and a maximum value indicative of a maximal power level, said comparator producing a second value of said clock disable signal when said count is less than or equal to said predetermined value so as to generate an output pulse and for producing a first value of said clock disable signal when said count is greater than said predetermined value so as to suppress a reference clock pulse.

9. In an integrated circuit having core logic having scannable memory elements configurable in scan mode for shifting in a test stimulus during testing and shifting out captured data, and a capture mode for capturing the response of said elements to said test stimulus, the improvement comprising:

a test controller for generating first and second values of a test phase signal, said first value being indicative of a requirement for performing a phase of a test of said circuit at a lower power level than a maximal power level, said second value being indicative of a requirement for performing a phase of a test at a maximum frequency of a test clock;

a clock controller having means responsive to a reference clock applied to said controller for generating a test clock signal for use by said core logic and said test controller, said means including means responsive to said first value of said test phase signal for periodically suppressing clock cycles from said reference clock so as to operate said circuit at said lower power level than said maximal power level and responsive to said second value of said test phase signal for not suppressing clock cycles from said reference clock so as to operate said circuit at the frequency of said reference clock.

10. In an integrated circuit as defined in claim 9, said means operable including a duty cycle generator for generating first and second values of a clock disable signal for disabling and enabling clock cycles of said reference clock.

11. In an integrated circuit as defined in claim 10, said duty cycle generator including a counter having a clock input for receiving said reference clock and a comparator for comparing the count of said counter against a predetermined value, said counter being responsive to said first value of said test phase signal by continuously counting clock cycles between 0 and a maximum value indicative of a maximal power level, said comparator producing said second value of said clock disable signal when said count is less than or equal to said predetermined value so as to generate an output pulse and for producing said first value of said clock disable signal when said count is greater than said predetermined value so as to suppress a reference clock pulse.

12. In an integrated circuit as defined in claim 9, further including means responsive to first and second test phase signals and said clock disable signal for generating said system clock signal.

13. In an integrated circuit controller as defined in claim 9, said means responsive to said first value of said test phase signal being further responsive to a power level signal representative of a desired fraction of the maximal power level for suppressing all but a number of clock cycles specified by said power level signal from consecutive sequences of a number of clock cycles of said reference clock representative of said maximal power level.

14. In an integrated circuit as defined in claim 9, said clock controller further including:

a duty cycle generator having a test phase input for receiving said test phase signal, a duty cycle input for receiving a duty cycle signal representative of said lower power level, and a clock input for said reference clock, said duty cycle generator generating a clock disable signal for each cycle of said reference clock in response to a second value of said test phase signal and otherwise generating a clock disable signal for only one cycle of each of a predetermined number of cycles of said reference clock specified by said duty cycle signal;

an AND gate for receiving said test phase signal and said clock disable signal and providing an output;

a transparent latch having a clock input for receiving said reference clock, an input for receiving said output of said AND gate output and a latch output; and an OR gate having an input for said reference clock and an input for said latch output.

15. In an integrated circuit as defined in claim 14, said duty cycle generator further including a counter having a clock input for receiving said reference clock and a comparator for comparing the count of said counter against a predetermined value, said counter being responsive to said first value of said test phase signal by continuously counting clock cycles between 0 and a maximum value indicative of a maximal power level, said comparator producing a second value of said clock disable signal when said count is less than or equal to said predetermined value so as to generate an output pulse and for producing a first value of said clock disable signal when said count is greater than said predetermined value so as to suppress a reference clock pulse.

16. In a integrated circuit as defined in claim 9, further including means providing said reference clock.

17. In an integrated circuit as defined in claim 9, further including a phase-lock loop responsive to an input reference clock and applying said reference clock to said clock controller.

18. In an integrated circuit as defined in claim 17, further including a multiplexer responsive to a test mode signal for selectively applying the output of phase-lock loop or the clock input to said core logic to said phase-lock loop.

19. In a method of testing a digital circuit or system, having a plurality of scannable memory elements, in accordance with a conventional built-in self-test (BIST) method in which, at a reference clock, a test stimulus is shifted into the memory elements, the response of the elements is captured and the captured data is shifted out of the elements and analyzed, the improvement comprising controlling the average power consumption of the circuit during the test by:
   (a) suppressing clock pulses from said reference clock during phases of the test that do not require the maximum level of activity or a which the performance of the circuit is not to be evaluated;
   (b) suppressing no clock pulses from the reference clock in phases of the test in which the performance of the circuit is to be evaluated, so that the conditions are substantially as those of normal mode of operation of the circuit; and
   wherein said step of suppressing clock pulses includes, for each sequence of a predetermined number of consecutive clock pulses representative of a maximal power level, generating a number of pulses such that the ratio of said number of pulses to said predetermined number of consecutive clock pulses is a predetermined fraction of said maximal power level and suppressing all other pulses in said sequence.

20. A method as defined in claim 19, said step of generating a number of pulses comprising counting reference clock cycles from 0 to said predetermined number of consecutive clock pulses and generating an output pulse when said counter reaches said predetermined number.

21. A method as defined in claim 19, further including the step of, prior to performing a test, specifying the number of clock cycles which are to be suppressed during said phases of the test that do not require the maximum level of activity.

22. A method as defined in claim 19, further including the step of, during a test, specifying the number of clock cycles which are to be suppressed during said phases of the test that do not require the maximum level of activity.

23. In a method of testing a digital circuit or system, having a core logic and a plurality of scannable memory elements, in accordance with a conventional built-in self-test (BIST) method in which, at a reference clock, a test stimulus is shifted into the memory elements, the response of the elements is captured and the captured data is shifted out of the elements and analysed, the improvement comprising controlling the average power consumption of the circuit during the test by:
   (a) providing a signal representative of a reduced power level for use during non-performance critical phases of a test, said signal being expressed in terms of a number of clock pulses;
   (b) providing a signal indicating whether a current phase of a test is a performance critical test phase or a non-performance critical test phase;
   (c) for each performance critical test phase, generating a test clock having the same frequency as said reference clock;
   (d) for each non-performance critical test phase, for each of a plurality of consecutive clock pulses corresponding to a maximal power level, generating a number of clock pulses specified by said signal representative of a reduced power level and suppressing all other pulses of said plurality of pulses such that the power consumption during said non-performance critical test phase is a predetermined fraction of said maximal power level.

* * * * *

UNITED STATES PATENT AND TRADEMARK OFFICE
CERTIFICATE OF CORRECTION

PATENT NO. : 6,330,681 B1  
DATED : December 11, 2001  
INVENTOR(S) : Cote et al.

Page 1 of 1

It is certified that error appears in the above-identified patent and that said Letters Patent is hereby corrected as shown below:

<u>Column 1,</u>
Line 34, after "or," delete "a" and insert -- in -- therein.

Signed and Sealed this

Thirtieth Day of April, 2002

Attest:

Attesting Officer

JAMES E. ROGAN
*Director of the United States Patent and Trademark Office*